(12) United States Patent
Huang et al.

(10) Patent No.: US 8,996,850 B2
(45) Date of Patent: Mar. 31, 2015

(54) SERVER SYSTEM AND AUTO-RESET METHOD OF THE SAME

(71) Applicants: Inventec (Pudong) Technology Corporation, Shanghai (CN); Inventec Corporation, Taipei (TW)

(72) Inventors: Lan Huang, Shanghai (CN); Crius Yang, Shanghai (CN)

(73) Assignees: Inventec (Pudong) Technology Corporation, Shanghai (CN); Inventec Corporation, Taipei (TW)

( * ) Notice: Subject to any disclaimer, the term of this patent is extended or adjusted under 35 U.S.C. 154(b) by 258 days.

(21) Appl. No.: 13/798,151

(22) Filed: Mar. 13, 2013

(65) Prior Publication Data

US 2014/0156980 A1 Jun. 5, 2014

(30) Foreign Application Priority Data

Nov. 30, 2012 (CN) .......................... 2012 1 0507028

(51) Int. Cl.
*G06F 1/24* (2006.01)
*G06F 1/26* (2006.01)
*H05K 7/14* (2006.01)

(52) U.S. Cl.
CPC .. *G06F 1/24* (2013.01); *G06F 1/26* (2013.01); *H05K 7/1498* (2013.01)

USPC ............................................................ 713/1

(58) Field of Classification Search
CPC .............. G06F 1/24; G06F 1/26; G06F 8/665
USPC .......................................................... 713/1
See application file for complete search history.

(56) References Cited

U.S. PATENT DOCUMENTS

2011/0087910 A1* 4/2011 Lambert et al. ............... 713/323
2013/0132700 A1* 5/2013 Liu et al. ....................... 711/170

* cited by examiner

*Primary Examiner* — Albert Wang
(74) *Attorney, Agent, or Firm* — CKC & Partners Co., Ltd.

(57) ABSTRACT

A server system having an auto-reset mechanism is provided. The server system comprises a power control circuit, a power processing circuit, a CPLD and a control circuit. The power control circuit generates a control signal. The power processing circuit operates according to the control signal to receive a first power and generate a second power. The CPLD receives the second power and operates accordingly and generates a power reset signal when the CPLD finishes a update process. The control circuit controls the power control circuit to stop to generate the control signal to turn off the power processing circuit to further disable the CPLD in a certain time period according to the power reset signal and controls the power control circuit to activate the power processing circuit to further activate and reset the CPLD after the certain time period.

14 Claims, 4 Drawing Sheets

SERVER SYSTEM AND AUTO-RESET METHOD OF THE SAME

RELATED APPLICATIONS

This application claims priority to Chinese Application Serial Number 201210507028.5, filed Nov. 30, 2012, which is herein incorporated by reference.

BACKGROUND

1. Field of Invention

The disclosure relates to a reset technique, and more particularly, relates to a server system and an auto-reset method of the same.

2. Description of Related Art

Network is an indispensable way for communication in the life of modern times. As an important tool for providing network services, a server should be capable of processing large amounts of data. Therefore a server should be well designed both in data processing and cooling capacities, so as to achieve the most effective control.

Recently, with respect to the design of server system, a CPLD is often used to realize the functions such as power management, cooling mechanism management and event recording for systems. As the design becomes more and more complex, it is often required to modify the program code recorded into the CPLD, so it is also required to conduct an update process frequently. However, after the CPLD finishes the update process, it is required to reset the CPLD to operate according to the new program code stably. Currently, there is still no effective auto-reset mechanism available to allow the CPLD to be conveniently and quickly auto-reset after finishing the update process.

Therefore, how to design a new server system and an auto-reset method of the same capable of realizing the purpose mentioned above has become a problem that needs to be addressed in the art.

SUMMARY

Therefore, an aspect of the disclosure provides an auto-reset method applied to a server system. The auto-reset method includes the following steps: making a power control circuit of the server system operate to generate a control signal; making a power processing circuit of the server system operate according to the control signal to receive a first power source and generate a second power source; making a CPLD of the server system receive the second power source and operate accordingly; making a function circuit module of the server receive a third power source and operate accordingly; making the CPLD conduct an update process, making the third power source stop supplying power to the function circuit module to turn off the function circuit module first after the update process is finished such that the function circuit module is turned off, and further generating the power reset signal to the control circuit of the server system; controlling the power control circuit to stop generating the control signal by the control circuit to turn off the power processing circuit to further disable the CPLD in a certain time period according to the power reset signal; and controlling the power control circuit to generate the control signal by the control circuit to activate the power processing circuit to further activate and reset the CPLD after the certain time period.

According to an embodiment of the disclosure, wherein the step that the control circuit controls the power control circuit to stop generating the control signal according to the power reset signal further includes: making the control circuit drain a current of a working power corresponding to the control circuit in a certain time period according to the power reset signal.

According to an embodiment of the disclosure, the power control circuit further has a delay mechanism to delay the time by which the control signal generation is stopped and the time from which the control signal is regenerated after receiving the power reset signal.

Another aspect of the disclosure provides an auto-reset method applied to a server system. The auto-reset method includes the following steps: making a power control circuit of the server system operate to generate a control signal; making a power processing circuit of the server system operate according to the control signal to receive a first power source and generate a second power source; making a CPLD of the server system receive the second power source and operate accordingly; making the CPLD conduct an update process and generate a power reset signal to the control circuit of the server system after finishing the update process; controlling the power control circuit to stop generating the control signal by the control circuit to turn off the power processing circuit to further disable the CPLD in a certain time period according to the power reset signal; and controlling the power control circuit to generate the control signal by the control circuit to activate the power processing circuit to further activate and reset the CPLD after the certain time period.

According to an embodiment of the disclosure, the step that the control circuit controls the power control circuit to stop generating the control signal according to the power reset signal further includes: making the control circuit drain a current of a working power corresponding to the control circuit according to the power reset signal in a certain time period.

According to an embodiment of the disclosure, the power control circuit further has a delay mechanism to delay the time by which the control signal generation is stopped and the time from which the control signal is regenerated after receiving the power reset signal.

A further aspect of the disclosure provides a server system having an auto-reset mechanism, wherein the server system includes a power control circuit, a power processing circuit, a CPLD and a control circuit. The power control circuit is used to generate a control signal. The power processing circuit operates according to the control signal to receive a first power source and generate a second power source. The CPLD (complex programmable logic device) receives the second power source and operates accordingly and generates a power reset signal when the CPLD finishes an update process. The control circuit controls the power control circuit to stop generating the control signal to turn off the power processing circuit, further disable the CPLD in a certain time period according to the power reset signal and controls the power control circuit to generate the control signal to activate the power processing circuit, further activate and reset the CPLD after the certain time period.

According to an embodiment of the disclosure, the control circuit is a current drain circuit used to drain a current of a working power corresponding to the control circuit when receiving the power reset signal. The control circuit includes a Schottky diode, a first transistor and a second transistor. The Schottky diode has an anode and a cathode. The first transistor includes a first source electrode and a first gate electrode connected with the anode of the Schottky diode. The second transistor includes a second gate electrode connected with a first drain electrode of the first transistor, a second source electrode connected with a ground terminal, and a second drain electrode connected with the working power. When the cathode of the Schottky diode receives the power reset signal, the first transistor is disabled in a certain time period to further enable the second transistor to make the second transistor drain the current of the working power to further control the power control circuit to stop generating the control signal.

According to an embodiment of the disclosure, the Schottky diode enables the first transistor after a certain time period to further disable the second transistor to make the second transistor stop to drain the current of the working power to further control the power control circuit to generate the control signal.

According to an embodiment of the disclosure, the power control circuit further has a delay mechanism to delay the time by which the control signal generation is stopped and the time from which the control signal is regenerated after the second transistor drains the current of the working power.

According to an embodiment of the disclosure, the power control circuit includes a power control chip and a power conversion module. The power control chip controls the power conversion module to generate the control signal according to the working power.

According to an embodiment of the disclosure, the server system further includes a DC power supply module which is directly reset after the CPLD finishes the update process.

According to an embodiment of the disclosure, the CPLD operates to conduct power management, cooling mechanism management, event recording and other arrangements and managements to a function circuit module on a motherboard.

BRIEF DESCRIPTION OF THE DRAWINGS

In order to make the foregoing as well as other aspects, features, advantages, and embodiments of the present invention more apparent, the accompanying drawings are described as follows.

DETAILED DESCRIPTION

Figure 1:
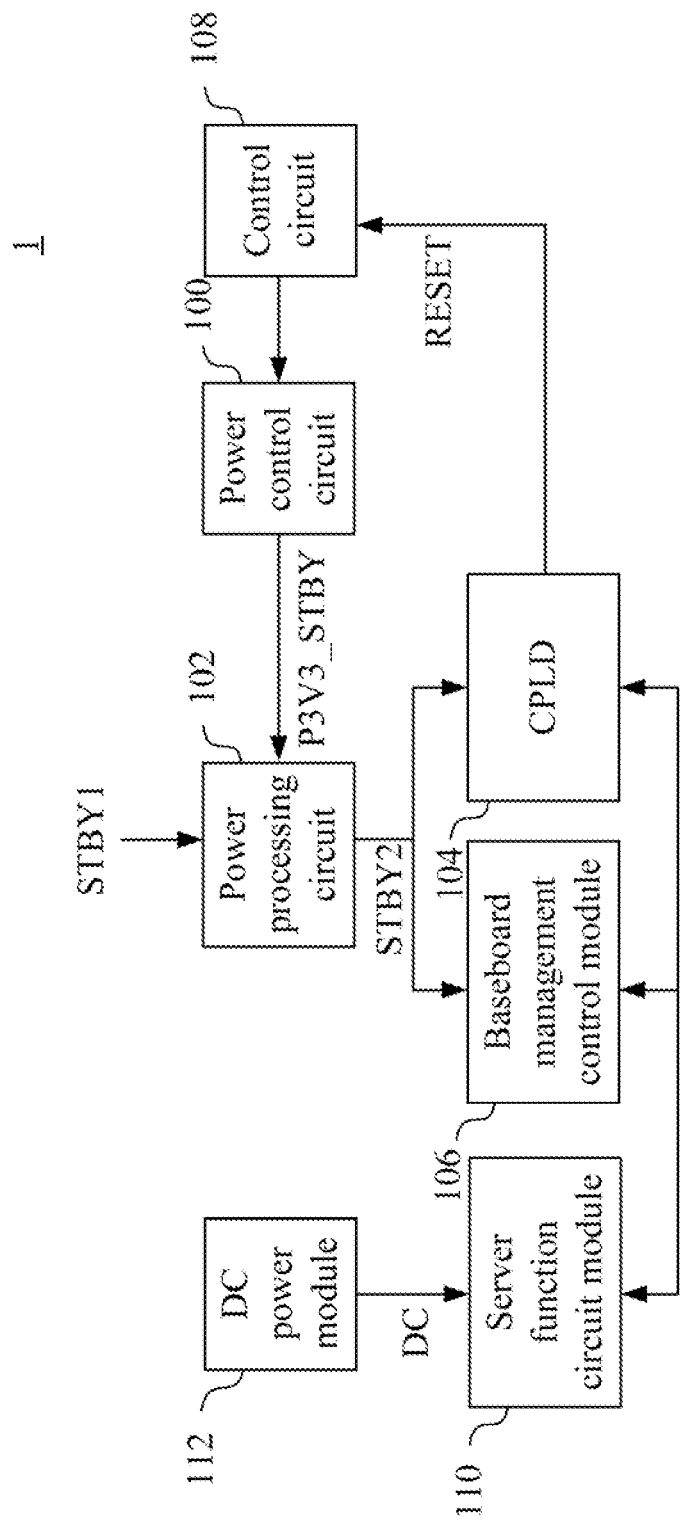
FIG. 1 is a block diagram of a server system having an auto-reset mechanism in an embodiment of the disclosure.

Referring FIG. 1, it is a block diagram of a server system 1 having an auto-reset mechanism in an embodiment of the disclosure. The server system 1 includes a power control circuit 100, a power processing circuit 102, a CPLD 104, a baseboard management control module 106, a control circuit 108 and a function circuit module 110, wherein the power control circuit 100, the power processing circuit 102, the CPLD 104, the baseboard management control module 106, the control circuit 108 and the function circuit module 110 can be formed on one motherboard.

The power control circuit 100 is used to generate a control signal P3V3_STBY. The power processing circuit 102 operates according to the control signal P3V3_STBY to receive a first power source STBY1 and generate a second power source STBY2. The baseboard management control module 106 operates according to the second power source STBY2 supplied by the power processing circuit 102, so as to detect and coordinate the working environment of the server system 1. In addition to the baseboard management control module 106 which operates according to the second power source STBY2, the CPLD 104 also receives the second power source STBY2 from the power processing circuit 102 and operates accordingly.

Additionally, the function circuit module 110 operates according to a third power DC supplied by a DC power module 112 and is used to perform various server functions, such as but not limited to data accessing and processing performed based on the access requests transmitted from the external network.

In different embodiments, the foregoing CPLD 104 can manage a power sequence or other forms of power parameters of the function circuit module 110 of the server on the motherboard, control the cooling mechanism such as the operation of fans or water cooling system (not shown) together with the foregoing baseboard management control module 106, record the occurrence of events or perform all the functions mentioned above according to the programmed content thereof. Since the CPLD 104 can be designed to perform more and more functions, it often needs to be updated when an error occurs in the programmed program code of the CPLD 104. However, it is required to reset the CPLD 104 after the update process, so as to allow the CPLD 104 to operate stably according to the code programmed by the update process.

When the CPLD 104 finishes the update process, the DC power module 112 can be auto-reset by the system, so as to reset the function circuit module 110 used for receiving the third power DC. However since the power processing circuit 102 is not controlled by the system as the DC power module 112, if the power processing circuit 102 cannot be auto-reset, the CPLD 104 can not be reset as well. Accordingly, the CPLD 104 is not able to operate according to the updated code.

Therefore, the control circuit 108 of the disclosure can receive a power reset signal RESET generated by the CPLD 104 after the CPLD 104 finishes the update process, and control the power control circuit 100 to reset the power processing circuit 102 accordingly to further make the CPLD 104 auto-reset. It is noted that, in an embodiment, the control circuit 108 of the disclosure can reset the CPLD 104 after the DC power module 112 stops to generate the third power DC to the function circuit module 110 such that the function circuit module 110 is turned off. Therefore, both the function circuit module 110 and the CPLD 104 can be reset.

More details of the reset mechanism of the control circuit 108 will be described in hereinafter.

Figure 2:
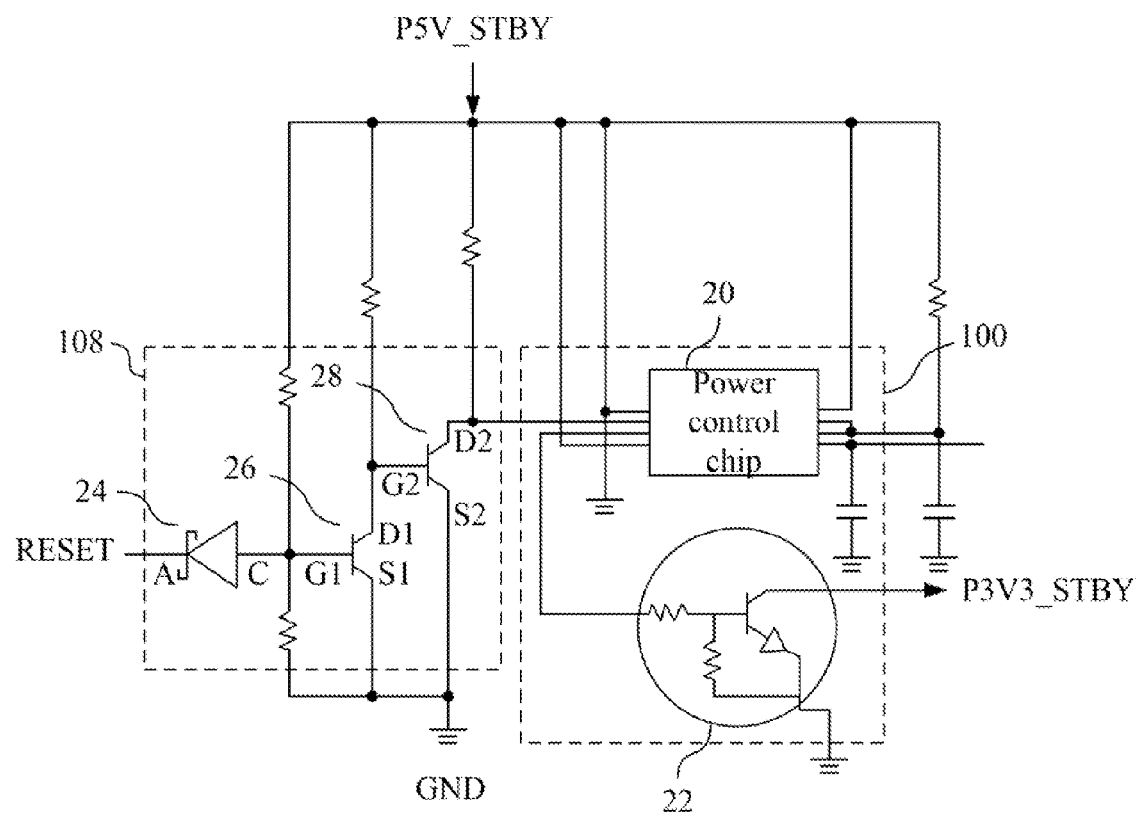
FIG. 2 is a circuit diagram of a control circuit and an AC power module of an embodiment of the disclosure.

Referring to FIG. 2, it is a circuit diagram of the control circuit 108 and the power control circuit 100 in an embodiment of the disclosure.

In this embodiment, the power control circuit 100 includes a power control chip 20 and a power conversion module 22. The power control chip 20 operates according to a working power P5V_STBY to control the power conversion module 22 to generate the foregoing control signal P3V3_STBY. In an embodiment, the working power P5V_STBY is of 5 V and the generated control signal P3V3_STBY is of 3.3 V. However, in other embodiments, the voltage of the working power P5V_STBY and the control signal P3V3_STBY can be of other values and are not limited by the embodiment mentioned above.

In this embodiment, the control circuit 108 is a current drain circuit which mainly includes a Schottky diode 24, a first transistor 26 and a second transistor 28.

The Schottky diode 24 has an anode C and a cathode A. The first transistor 26 includes a first source electrode S1 and a first gate electrode G1 connected with the anode C of the Schottky diode 24. In this embodiment, the first source electrode S1 is connected to a ground terminal GND. The second transistor 28 includes a second gate electrode G2 connected with a first drain electrode D1 of the first transistor 26, a second source electrode S2 connected to the ground terminal GND, and a second drain electrode D2 connected with the working power P5V_STBY. In the present embodiment, the first transistor 26 and the second transistor 28 are both n-type transistors.

The cathode A of the Schottky diode 24 correspondingly receives the power reset signal RESET transmitted by the CPLD 104 of FIG. 1. In this embodiment, after receiving the power reset signal RESET, the Schottky diode 24 generates an active-low pulse signal accordingly. Therefore, in a normal operation state, the anode C of the Schottky diode 24 outputs active-high signals continuously and the power reset signal RESET makes the anode C generate active-low signals in a corresponding certain time period, so that the first transistor 26 is disabled by the first gate electrode G1. The disabling of the first transistor 26 makes the first drain electrode D1 be charged by the working power P5V_STBY and turned to active-high state to further enable the second transistor 28.

After being enabled, the second transistor 28 drains a current of the working power P5V_STBY. Therefore, the voltage of the second drain electrode D2 is decreased to nearly zero and the power control chip 20 in the power control circuit 100 controls the power conversion module 22 to stop generating the control signal P3V3_STBY. The stop of the generation of the control signal P3V3_STBY makes the power processing circuit 102 stop supplying the second power source STBY2 to the CPLD 104 according to the first power source STBY1, thereby further turning off the CPLD 104.

After the certain time period corresponding to the pulse signal, the anode C of the Schottky diode 24 generates active-high output again, so as to enable the first transistor 26. The enabled first transistor 26 drains a current of the first drain electrode D1, to reduce the voltage of the first drain electrode D1 and further disable the second transistor 28. The disabled second transistor 28 cannot drain the current of the working power P5V_STBY anymore, so the voltage of the second drain electrode D2 is increased along with the input of the working power P5V_STBY, allowing the power control chip 20 in the power control circuit 100 to control the power conversion module 22 to generate the control signal P3V3_STBY according to the working power P5V_STBY. The regeneration of the control signal P3V3_STBY makes the power processing circuit 102 begin to supply the second power source STBY2 to the CPLD 104, thereby further reactivating the CPLD 104.

In an embodiment, the power control chip 20 in the power control circuit 100 further has a delay mechanism. When the second transistor 28 is enabled to drain the current of the working power P5V_STBY and make the voltage of the second drain electrode D2 be reduced to nearly zero, the power control chip 20 in the power control circuit 100 delays the time by which the power conversion module 22 is controlled to stop generating the control signal P3V3_STBY, and thus the time from which the power conversion module 22 is controlled to regenerate the control signal P3V3_STBY after the certain time period is also delayed.

Since the CPLD 104 and other modules operating according to the second power source STBY2 may need a period of time to pause the performing work after finishing the update process, if the reset mechanism mentioned above is activated in real time, it may cause data loss or damage. Therefore, through the delay mechanism the power control circuit 100 delays the time by which the power processing circuit 102 and the CPLD 104 are reset, so as to ensure data integrity.

It shall be noted that FIG. 2 corresponding to the embodiment mentioned above takes n-type bipolar junction transistor (BJT) as an example, but in other embodiments, it can also be achieved by metal-oxide-semiconductor transistor, and also by p-type transistor after proper adjustment.

Therefore, by the design of the disclosure, after finishing the update process, the CPLD 104 can transmit a power reset signal to make the control circuit control the power control circuit to stop generating the control signal to turn off the power processing circuit to further turn off the CPLD in a certain time period, and control the power control circuit to regenerate the control signal to activate the power processing circuit to further reset the CPLD after the certain time period.

Figure 3:
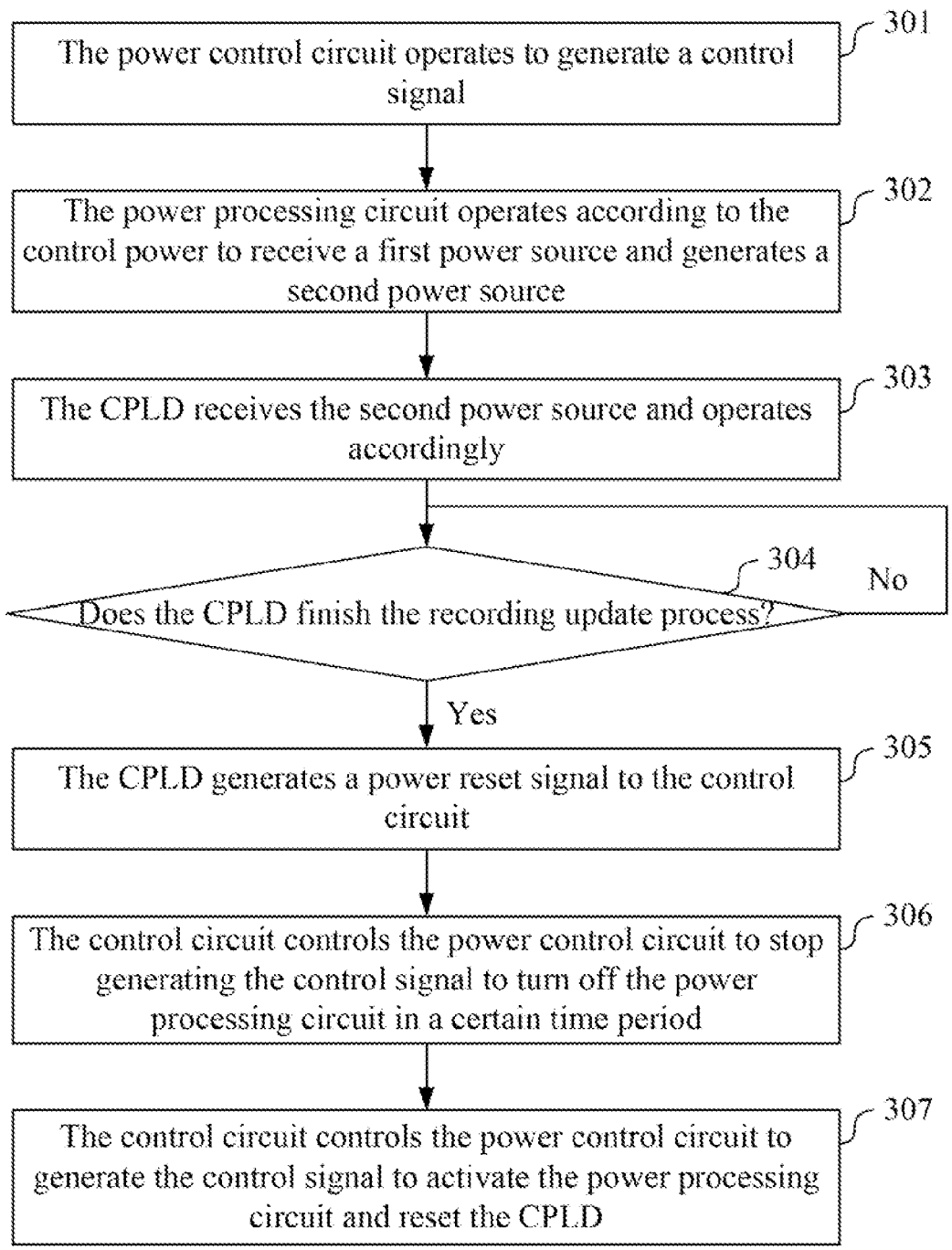
FIG. 3 is a flow chart of an auto-reset mechanism of an embodiment of the disclosure.

Referring to FIG. 3, it is a flow chart of an auto-reset method 300 of an embodiment of the disclosure. The auto-reset method 300 can be applied to the server system 1 shown in FIG. 1, and includes the following steps:

in Step 301, making the power control circuit 100 operate according to the working power P5V_STBY to generate the control signal P3V3_STBY;

in Step 302, making the power processing circuit 102 operate according to the control signal P3V3_STBY to receive the first power source STBY1 and generate the second power source STBY2;

in Step 303, making the CPLD 104 receive the second power source STBY2 and operate accordingly;

in Step 304, determining whether the CPLD 104 has finished an update process;

when the CPLD 104 has not finished the update process, going back to Step 304 to continue to make the determination; and when the CPLD 104 has finished the update process, generating a power reset signal RESET to a control circuit 108 in Step 305;

in Step 306, the control circuit 108 controls the power control circuit 100 to stop generating the control signal P3V3_STBY to turn off the power processing circuit 102 to further disable the CPLD 104 in a certain time period according to the power reset signal RESET; and in Step 307, the control circuit 108 controls the power control circuit 100 to generate the control signal P3V3_STBY to activate the power processing circuit 102 to further activate and reset the CPLD 104 after the certain time period.

Figure 4:
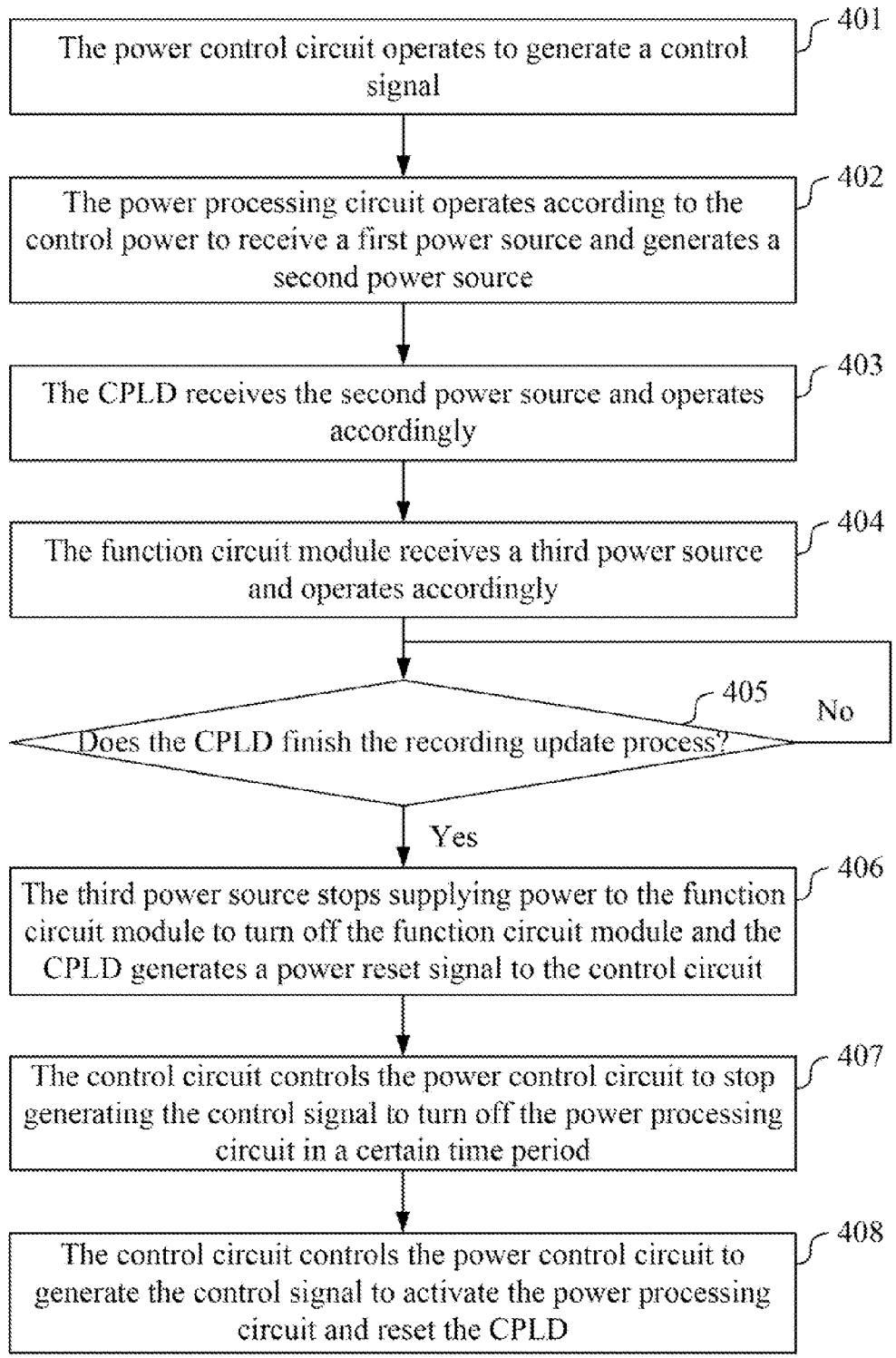
FIG. 4 is a flow chart of an auto-reset mechanism of an embodiment of the disclosure.

Referring to FIG. 4, it is a flow chart of an auto-reset method 400 of an embodiment of the disclosure. The auto-reset method 400 can be applied to the server system 1 shown in FIG. 1, and includes the following steps:

in Step 401, making the power control circuit 100 operate according to the working power P5V_STBY to generate the control signal P3V3_STBY;

in Step 402, making the power processing circuit 102 operate according to the control signal P3V3_STBY to receive the first power source STBY1 and generate the second power source STBY2;

in Step 403, making the CPLD 104 receive the second power source STBY2 and operate accordingly;

in Step 404, making the function circuit module 110 receive a third power DC and operate accordingly;

in Step 405, determining whether the CPLD 104 has finished the update process;

when the CPLD 104 has not finished the update process, going back to Step 405 to continue to determine; and when the CPLD 104 has finished the update process, making the third power DC stop supplying power to the function circuit module 110 to turn off the function circuit module 110 and generate a power reset signal RESET to a control circuit 108 in Step 406;

in Step 407, the control circuit 108 controls the power control circuit 100 to stop generating the control signal P3V3_STBY to turn off the power processing circuit 102 to further disable the CPLD 104 in a certain time period according to the power reset signal RESET; and in Step 408, the control circuit 108 controls the power control circuit 100 to generate the control signal P3V3_STBY to activate the power processing circuit 102 to further activate and reset the CPLD 104 after the certain time period.

Although the present invention has been disclosed with reference to the above embodiments, these embodiments are not intended to limit the present invention. It will be apparent to those of skills in the art that various modifications and variations can be made without departing from the spirit and scope of the present invention. Therefore, the scope of the present invention shall be defined by the appended claims.

What is claimed is:

1. An auto-reset method applied to a server system, comprising:
   making a power control circuit of the server system operate to generate a control signal;
   making a power processing circuit of the server system operate according to the control signal to receive a first power source and generate a second power source;
   making a CPLD of the server system receive the second power source and operate accordingly;
   making a function circuit module of the server receive a third power source and operate accordingly;
   making the CPLD conduct an update process, making the third power source stop supplying power to the function circuit module first after the update process is finished such that the function circuit module is turned off, and further generating a power reset signal to a control circuit of the server system;
   controlling the power control circuit to stop generating the control signal by the control circuit to turn off the power processing circuit to further disable the CPLD in a certain time period according to the power reset signal; and
   controlling the power control circuit to generate the control signal by the control circuit to activate the power processing circuit to further activate and reset the CPLD after the certain time period.

2. The auto-reset method of claim 1, wherein the step that the control circuit controls the power control circuit to stop generating the control signal according to the power reset signal further comprises:
   making the control circuit drain a current of a working power corresponding to the control circuit in the certain time period according to the power reset signal.

3. The auto-reset method of claim 1, wherein the power control circuit further has a delay mechanism to delay the time by which the control signal generation is stopped and the time from which the control signal is regenerated after receiving the power reset signal.

4. An auto-reset method applied to a server system, comprising:
   making a power control circuit of the server system operate to generate a control signal;
   making a power processing circuit of the server system operate according to the control signal to receive a first power source and generate a second power source;
   making a CPLD of the server system receive the second power source and operate accordingly;
   making the CPLD conduct an update process and generating a power reset signal to a control circuit of the server system after finishing the update process;
   controlling the power control circuit to stop generating the control signal by the control circuit to turn off the power processing circuit to further disable the CPLD in a certain time period according to the power reset signal; and
   controlling the power control circuit to generate the control signal by the control circuit to activate the power processing circuit to further activate and reset the CPLD after the certain time period.

5. The auto-reset method of claim 4, wherein the step that the control circuit controls the power control circuit to stop generating the control signal according to the power reset signal further comprises: making the control circuit drain a current of a working power corresponding to the control circuit in the certain time period according to the power reset signal.

6. The auto-reset method of claim 4, wherein the power control circuit further has a delay mechanism to delay the time by which the control signal generation is stopped and the time from which the control signal is regenerated after receiving the power reset signal.

7. A server system having an auto-reset mechanism, comprising:
   a power control circuit used to generate a control signal;
   a power processing circuit operating according to the control signal to receive a first power source and generate a second power source;
   a CPLD (complex programmable logic device) which receives the second power source and operates accordingly and generates a power reset signal when the CPLD finishes an update process;
   a control circuit which controls the power control circuit to stop generating the control signal to turn off the power processing circuit, further disable the CPLD in a certain time period according to the power reset signal, and controls the power control circuit to generate the control signal to activate the power processing circuit, further activate and reset the CPLD after the certain time period.

8. The server system of claim 7, wherein the control circuit is a current drain circuit used to drain a current of a working power corresponding to the control circuit when receiving the power reset signal.

9. The server system of claim 8, wherein the control circuit comprises:
   a Schottky diode having an anode and a cathode;
   a first transistor comprising a first source electrode and a first gate electrode connected with the anode of the Schottky diode; and
   a second transistor comprising a second gate electrode connected with a first drain electrode of the first transistor and a second source electrode connected with a ground terminal and a second drain electrode connected with the working power;
   wherein the first transistor is disabled in a certain time period when the cathode of the Schottky diode receives the power reset signal, to further enable the second transistor to drain the current of the working power to further control the power control circuit to stop generating the control signal.

10. The server system of claim 9, wherein the Schottky diode enables the first transistor after the certain time period to further disable the second transistor to make the second transistor stop to drain the current of the working power to further control the power control circuit to generate the control signal.

11. The server system of claim 10, wherein the power control circuit further has a delay mechanism, so as to delay the time by which the control signal generation is stopped and the time from which the control signal is regenerated after the second transistor drains the current of the working power.

12. The server system of claim 9, wherein the power control circuit comprises a power control chip and a power conversion module, and the power control chip controls the power conversion module to generate the control signal according to the working power.

13. The server system of claim 9, further comprising a DC power supply module which is reset directly after the CPLD finishes the update process.

14. The server system of claim 9, wherein the CPLD operates to conduct a power management, a cooling mechanism management, an event recording, and other arrangements and combination to at least a function circuit module on the motherboard.

* * * * *